United States Patent
Au et al.

(10) Patent No.: US 6,207,502 B1
(45) Date of Patent: Mar. 27, 2001

(54) METHOD OF USING SOURCE/DRAIN NITRIDE FOR PERIPHERY FIELD OXIDE AND BIT-LINE OXIDE

(75) Inventors: Kenneth Au, Fremont; David K. Foote, San Jose; Steven K. Park, Cupertino; Fei Wang, San Jose; Bharath Rangarajan, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/426,255

(22) Filed: Oct. 25, 1999

(51) Int. Cl.[7] .................................................. H01L 21/8247
(52) U.S. Cl. ........................ 438/258; 438/287; 438/591
(58) Field of Search ................................... 438/257, 258, 438/261, 287, 591

(56) References Cited

U.S. PATENT DOCUMENTS 5,496,753 * 3/1996 Sakurai et al. ...................... 438/591
5,851,881 * 12/1998 Lin et al. ............................. 438/261
6,103,572 * 8/2000 Kirihara .............................. 438/261

* cited by examiner

*Primary Examiner*—Chandra Chaudhari
(74) *Attorney, Agent, or Firm*—Brinks Hofer Gilson & Lione

(57) ABSTRACT

A process for fabricating a MONOS type Flash cell device having a periphery field oxide region and a bit-line region includes providing a semiconductor substrate and growing a barrier silicon oxide layer to overlie semiconductor substrate. Thereafter, a thick silicon nitride layer is formed to overlie the barrier silicon oxide layer. A mask and etch are performed at the periphery of the MONOS type cell to form a trench in the semiconductor substrate. The periphery field oxide region is formed by depositing silicon oxide to fill the trench. Thereafter, a mask and etch are performed at the core of the MONOS cell to form a trench in the semiconductor substrate. The bit-line oxide region is formed by depositing silicon oxide to fill the trench. Thereafter, the thick silicon nitride layer is removed. Since the periphery field oxide region and bit-line region are formed before the thick nitride layer is removed, the formation of an unwanted bird's beak is reduced.

17 Claims, 2 Drawing Sheets

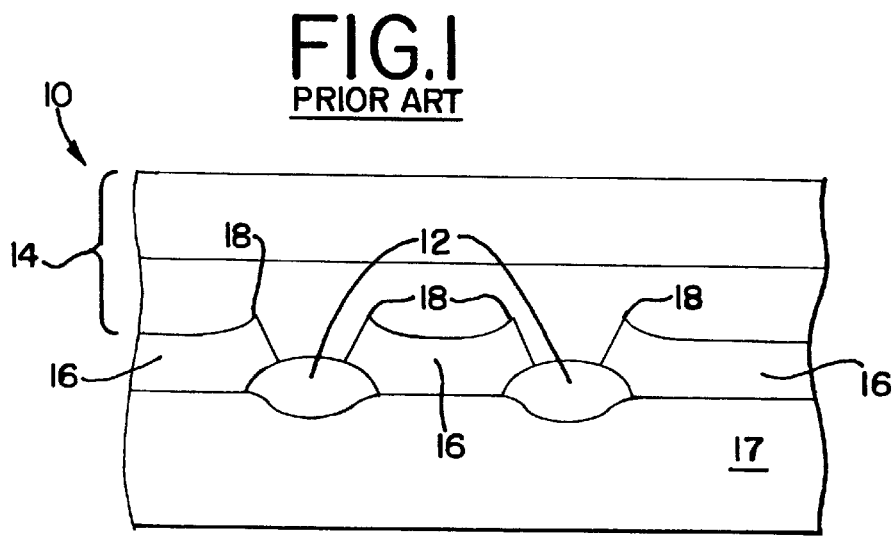
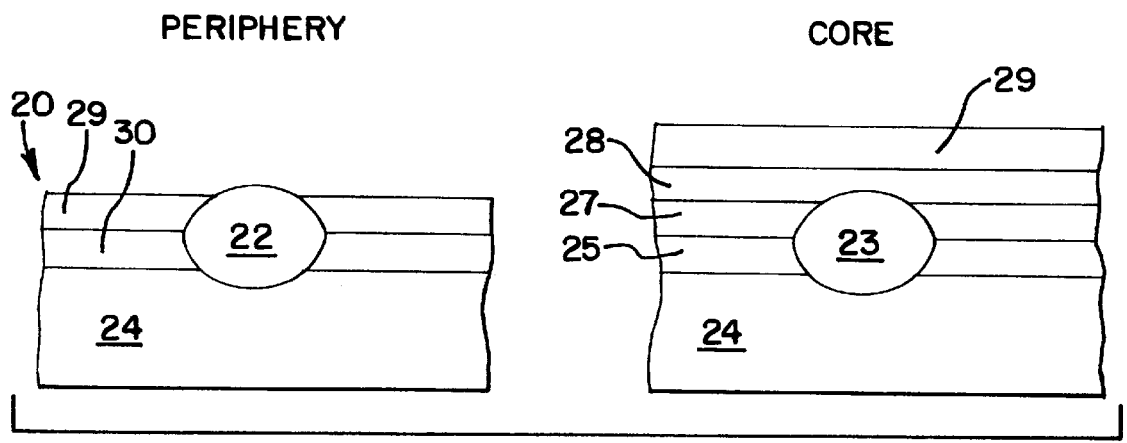

METHOD OF USING SOURCE/DRAIN NITRIDE FOR PERIPHERY FIELD OXIDE AND BIT-LINE OXIDE

CROSS REFERENCE TO RELATED APPLICATIONS

Related subject matter is disclosed in the following co-pending and commonly assigned U.S. patent applications filed on an even date herewith, and are all herein incorporated by reference.

U.S. Pat. Application Ser. No. 09/426,239, "A METHOD TO GENERATE A MONOS TYPE FLASH CELL USING POLYCRYSTALLINE SILICON AS AN ONO TOP LAYER".

U.S. Pat. Application Ser. No. 09/426,672, "HIGH TEMPERATURE OXIDE DEPOSITION PROCESS FOR FABRICATING AN ONO FLOATING-GATE ELECTRODE IN A TWO-BIT EEPROM DEVICE".

U.S. Pat. Application Ser. No. 09/433,041, "PROCESS FOR FABRICATING AN ONO STRUCTURE HAVING A SILICON-RICH SILICON NITRIDE LAYER".

U.S. Pat. Application Ser. No. 09/426,240, "PROCESS FOR FABRICATING AN ONO FLOATING-GATE ELECTRODE IN A TWO-BIT EEPROM DEVICE USING RAPID-THERMAL-CHEMICAL-VAPOR-DEPOSITION".

U.S. Pat. Application Ser. No. 09/433,186, "PROCESS FOR FABRICATING AN ONO STRUCTURE".

U.S. Pat. Application Ser. No. 09/433,037, "NITRIDATION PROCESS FOR FABRICATING AN ONO FLOATING-GATE ELECTRODE IN A TWO-BIT EEPROM DEVICE".

U.S. Pat. Application Ser. No. 09/426,430, "METHOD OF FABRICATING AN ONO DIELECTRIC BY NITRIDATION FOR MNOS MEMORY CELLS".

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) type cell. Referring to FIG. 1, a known MONOS type cell, generally referred to as 10, includes at least one bit-line oxide 12, a word line 14 and an ONO structure 16 which function together to determine the location of a charge stored in memory. The bit-line oxide 12 and the ONO structure 16 overlie a silicon wafer 17.

A problem exists with known MONOS type cell fabrication techniques in that a formation of the bit-line oxide 12 causes a bird's beak 18 of the ONO structure 16 to form and increasingly encroach the word line 14. The formation of the bird's beak 18 is aided by a thin nitride layer of the ONO structure which is typically only about 135 angstroms thick. The bird's beak 18 is an undesired result of the fabrication process for several reasons. For example, the bird's beak 18 causes an increase in surface area which enlarges the circuit. In addition, at a performance level, the bird's beak 18 can induce fatal stress damage to the silicon wafer 17, especially during bit-line oxidation steps. The stress results, for example, from a mismatch in thermal expansion properties between the ONO structure 18 and the silicon wafer 17.

Therefore, while recent advances in MONOS type cell technology have enabled memory designers to improve the MONOS type cells, numerous challenges exist in the fabrication of material layers within these devices. In particular, a reduction of a bird's beak formation of the MONOS type cell is required. Accordingly, advances in MONOS type cell fabrication technology are necessary to reduce the bird's beak and insure high quality MONOS type cell devices.

SUMMARY OF THE INVENTION

Such needs are met or exceeded by the present method for fabricating a MONOS type cell. According to an aspect of the present invention, an unwanted bird's beak feature of the MONOS type cell is reduced. Therefore, a higher quality is obtained for an ONO structure of the MONOS type cell.

More specifically, in one form, a process for fabricating a bit-line structure for a MONOS type cell includes providing a semiconductor substrate and growing a barrier silicon oxide layer to overlie semiconductor substrate. Thereafter, a thick silicon nitride layer is formed to overlie the barrier silicon oxide layer. A mask and etch are performed at the periphery of the MONOS type cell to form a trench in the semiconductor substrate. The periphery field oxide region is formed by depositing silicon oxide to fill the trench.

Thereafter, a mask and etch are performed at the core of the MONOS cell to form a trench in the semiconductor substrate. The bit-line oxide region is formed by depositing silicon oxide to fill the trench. Thereafter, the thick silicon nitride layer is removed. Since the periphery field oxide region and bit-line region are formed before the thick nitride layer is removed, the formation of an unwanted bird's beak is reduced.

BRIEF DESCRIPTION OF THE DRAWINGS

Other features and advantages of the invention will be apparent to those skilled in the art with reference to the detailed description and the drawings, of which:

FIG. 1 illustrates, in cross-section, a portion of a known MONOS type cell that includes an ONO structure with bird's beak formations; and FIGS. 2–5 illustrate, in cross-section, process steps for the fabrication of a MONOS type cell in accordance with embodiments of the invention.

Figure 3:
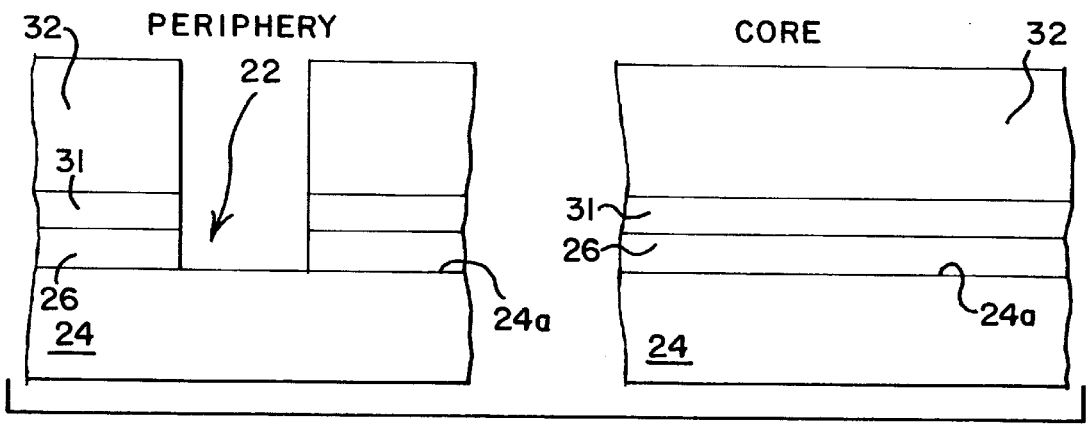

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

Referring to the figures, and in particular FIG. 2, periphery and core portions of a MONOS type Flash cell 20 are shown in cross-section which is suitable for use in EEPROM and Flash type devices. The MONOS type cell includes a periphery field oxide region 22 and a bit-line oxide region 23 located in a semiconductor substrate 24. At the core, overlying semiconductor substrate 24 is an ONO structure including a first (or bottom) silicon oxide layer 25, a silicon nitride layer 27 overlying the bottom silicon oxide layer 25, and a second (or top) silicon oxide layer 28 overlying the silicon nitride layer 27. Overlying the top silicon oxide layer is a polycrystalline silicon layer 29. At the periphery, a gate silicon oxide layer 30 overlies the semiconductor substrate 24, and the polycrystalline silicon layer 29 overlies the gate silicon oxide layer 30.

Those skilled in the art will recognize that the proper functioning of a MONOS type cell device necessarily requires that an electrical charge remain isolated in the regions of the silicon nitride layer 27 of the ONO structure to which it is initially introduced. In particular, the quality of ONO structure must be such that charge leakage paths are minimized In accordance with the invention, charge leakage within ONO structure is minimized by reducing a bird's beak formation common in known MONOS devices. The reduction of the bird's beak formation obtained by the present invention can be better understood following a description of a MONOS fabrication process carried out in accordance with the invention.

Referring now to FIG. 3, barrier silicon oxide layer 26 is grown to overlie the semiconductor substrate 24. Preferably, semiconductor substrate 24 is a single crystal silicon substrate. Semiconductor substrate 24 has an upper surface 24a previously processed to remove debris and native oxides. Preferably, an oxidation process is carried out until the barrier silicon oxide 26 has a thickness of about 50 to about 500 angstroms. The oxidation process can be carried out, for example, in either a batch-type thermal oxidation furnace, or alternatively, in a single-wafer oxidation apparatus.

Thereafter, a thick silicon nitride layer 31 is formed to overlie the silicon oxide layer 26. Thick silicon nitride layer 31 is formed, for example, by means of a rapid-thermal-chemical-vapor-deposition (RTCVD) process. The RTCVD process is carried out at a temperature of about 700 to about 800° C. The process is carried out for a period of time and at gas flow rates sufficient to form a silicon nitride layer preferably having a thickness of about 1700 angstroms. According to a preferred embodiment, the thick silicon nitride layer 31 should be wide enough to avoid being deformed during oxidation processes described below.

After forming the thick nitride layer 31, a first resist layer 32 is formed to mask the periphery field oxide region 22.

After masking the periphery field oxide region 22, preferably a shallow plasma etching is performed to form a trench in the semiconductor substrate 24. Preferably, the trench has a depth of about 300 to about 5000 angstroms into the semiconductor substrate 24, and more preferably the trench has a depth of about 2000 angstroms.

Figure 4:
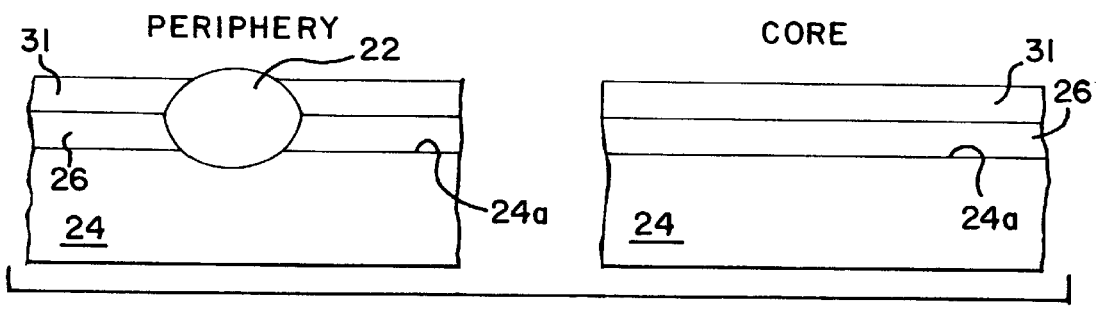

Referring to FIG. 4, after performing the periphery field oxide etch, the resist layer is removed from both the periphery and the core. Thereafter, according to an aspect of the present invention, the thick silicon nitride layer 31 remains, i.e., is not stripped. Silicon oxide is grown utilizing a known atmospheric oxidation technique. The atmospheric oxidation forms periphery field oxide region 22. Since the thick silicon nitride layer 31 was grown to a thickness of about 1700 angstroms, as described above, the thick silicon nitride layer 31 remains rigid and resists bending during the periphery field oxidation process. Therefore, the height of a bird's beak structure is reduced.

Figure 5:
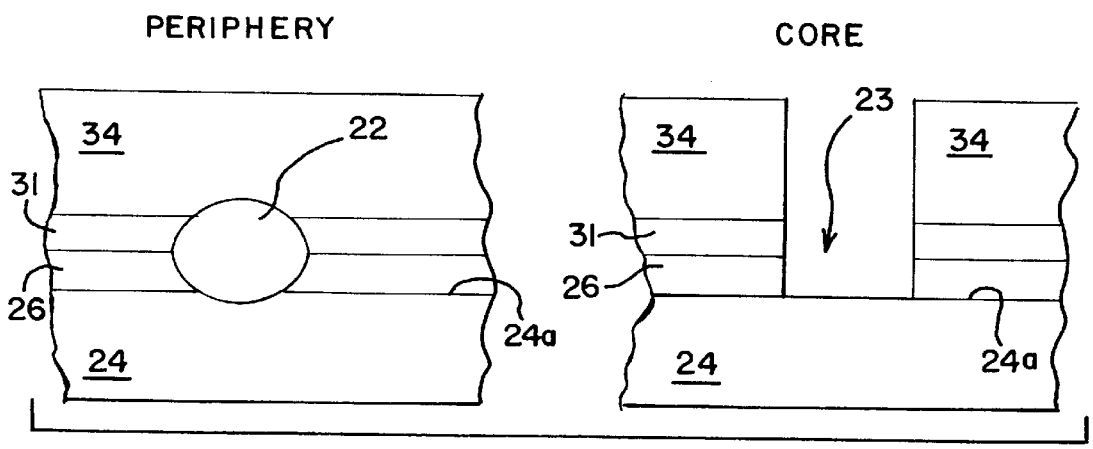

Referring to FIG. 5, after the periphery field oxide region 22 is grown, a second resist layer 34 is applied to mask the bit-line oxide region 23. After masking the bit-line oxide region 23, preferably a shallow plasma etching is performed to form a trench in the semiconductor substrate 24. Preferably, the trench has a depth of about 300 to about 5000 angstroms into the semiconductor substrate 24, and more preferably the trench has a depth of about 2000 angstroms.

Referring again to FIG. 2, after performing the bit-line oxide etch, the resist layer is removed from the periphery and the core. Without removing the thick silicon nitride layer 31, silicon oxide is grown utilizing known atmospheric oxidation techniques. The atmospheric oxidation forms bit-line oxide region 23. Since the thick silicon nitride layer 31 was grown to a thickness of about 1700 angstroms, the thick silicon nitride layer 31 resists bending during the bit-line oxidation process. Therefore, the height of a bird's beak structure is reduced.

After forming the bit-line oxide region 23, the thick nitride layer 31 is stripped at both the core and the periphery using, for example, a wet chemical stripping agent such as phosphoric acid. Thereafter, an ONO layer is constructed using known techniques to form the bottom silicon oxide layer 25 overlying the semiconductor substrate 24. In addition, the silicon nitride layer 27 is grown to overlie the bottom silicon oxide layer 25, and the top silicon nitride layer 28 is grown to overlie the silicon nitride layer 27.

After the ONO structure is deposited, the ONO structure is masked at the core and etched from the periphery using, for example, an acid etching process. Thereafter, those skilled in the art will appreciate that the gate silicon oxide layer 30 is grown on the periphery to overlie the semiconductor substrate 24.

Thereafter, the core and the periphery structures are further completed by preferably depositing a layer of amorphous polycrystalline silicon 29 to overlie the top oxide layer 28 of ONO structure, and the periphery gate oxide layer 30. Those skilled in the art will recognize that various gate-forming materials can be used to fabricate control-gate electrode. For example, control-gate electrode can be formed with polycrystalline silicon, amorphous silicon, a refractory metal silicide, and the like. Those skilled in the art will appreciate that to crystallize the amorphous polycrystalline silicon layer 29, and annealing process is performed. Thereafter, polycrystalline silicon gate patterning (not shown) is performed, and the MONOS type cell processing continues in a manner known in the art.

From the foregoing description, it should be understood that an improved method of generating a MONOS type flash cell has been shown and described which has many desirable attributes and advantages. According to the above described embodiments, an unwanted bird's beak feature of the cell can be reduced. Therefore, stress damage can be reduced to the semiconductor substrate caused by the bird's beak. In addition, the size of the transistor can be reduced, to reduce an overall circuit size.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating a periphery field oxide region at a periphery and a bit-line region at a core of a MONOS type Flash cell device, the process comprising the steps of:

providing a semiconductor substrate;

growing a barrier silicon oxide layer overlying said semiconductor substrate;

forming a thick silicon nitride layer overlying said barrier silicon oxide layer;

performing a mask and etch at the periphery to form a trench in said semiconductor substrate;

forming the periphery field oxide region by depositing silicon oxide to fill said trench;

performing a mask and etch at the core to form a trench in said semiconductor substrate;

forming the bit-line oxide region by depositing silicon oxide to fill said trench; and removing said thick silicon nitride layer.

2. The process of claim 1 further including the steps of:

depositing an oxide-nitride-oxide layer to overlie said semiconductor substrate;

performing a mask and etch of the oxide-nitride-oxide layer at the periphery;

growing a gate silicon oxide at the periphery; and depositing a polycrystalline silicon layer to overlie said oxide-nitride-oxide layer and said gate silicon oxide layer.

3. The process of claim 2, wherein said step of depositing said polycrystalline silicon layer comprises depositing an amorphous polycrystalline silicon.

4. The process of claim 3 further including the step of performing a thermal anneal after said step of depositing said amorphous polycrystalline silicon layer, wherein said step of thermal anneal is accomplished at about 900° C.

5. The process of claim 1, wherein the step of forming said thick silicon nitride layer comprises rapid-thermal-chemical-vapor-deposition to form said silicon nitride layer having a thickness of at least 1700 angstroms.

6. The process of claim 1, wherein the step of depositing said barrier silicon oxide layer comprises forming a barrier silicon oxide having a thickness of about 50 to about 500 angstroms.

7. The process of claim 1, wherein said trenches formed during said steps of etching have a depth in said semiconductor substrate of about 300 to about 5000 angstroms.

8. The process of claim 7, wherein said step of etching comprises utilizing a plasma etch process.

9. The process of claim 7, wherein said step of etching comprises utilizing a shallow trench isolation process.

10. A process for fabricating a periphery field oxide region at a periphery and a bit-line region at a core of a MONOS type Flash cell device, the process comprising the steps of:

providing a semiconductor substrate having at least one bit-line oxide region and at least one periphery field oxide region;

forming the bit-line region and periphery field oxide region by first growing a barrier silicon oxide layer overlying said semiconductor substrate, second, forming a thick silicon nitride layer overlying said barrier silicon oxide layer, third, performing a mask and etch at the periphery to form a trench in said semiconductor substrate, fourth, forming the periphery field oxide region by depositing silicon oxide to fill said trench, fifth, performing a mask and etch at the core to form a trench in said semiconductor substrate, sixth, forming the bit-line oxide region by depositing silicon oxide to fill said trench, and seventh, removing said thick silicon nitride layer;

depositing an oxide-nitride-oxide layer to overlie said semiconductor substrate;

performing a mask and etch of the oxide-nitride-oxide layer at the periphery;

growing a gate silicon oxide at the periphery; and depositing a polycrystalline silicon layer to overlie said oxide-nitride-oxide layer and said gate silicon oxide layer.

11. The process of claim 10, wherein the step of forming said silicon nitride layer comprises rapid-thermal-chemical-vapor-deposition to form a said silicon nitride layer having a thickness of at least 1700 angstroms.

12. The process of claim 10, wherein said step of depositing said polycrystalline silicon layer comprises depositing an amorphous polycrystalline silicon.

13. The process of claim 12 further including the step of performing a thermal anneal after said step of depositing said amorphous polycrystalline silicon layer, wherein said step of thermal anneal is accomplished at about 900° C.

14. The process of claim 10, wherein the step of depositing said barrier silicon oxide layer comprises forming a barrier silicon oxide having a thickness of about 50 to about 500 angstroms.

15. The process of claim 10, wherein said trenches formed during said steps of etching have a depth in said semiconductor substrate of about 300 to about 5000 angstroms.

16. The process of claim 15, wherein said step of etching comprises utilizing a plasma etch process.

17. The process of claim 15, wherein said step of etching comprises utilizing a shallow trench isolation process.

* * * * *